United States Patent [19]

Saito et al.

[11] Patent Number: 5,308,679
[45] Date of Patent: May 3, 1994

[54] RAVELING-PREVENTING AGENT FOR GLASS FIBER WOVEN FABRIC, AND GLASS FIBER WOVEN FABRIC TO WHICH THE AGENT IS APPLIED

[75] Inventors: Junichi Saito; Hirokazu Inoguchi; Keiichi Kato, all of Fukushima, Japan

[73] Assignee: Nitto Boseki Co., Ltd., Fukushima, Japan

[21] Appl. No.: 67,971

[22] Filed: May 27, 1993

[30] Foreign Application Priority Data

Jun. 16, 1992 [JP] Japan .................................. 4-156430

[51] Int. Cl.⁵ .............................................. B32B 23/02
[52] U.S. Cl. .................................... 428/193; 427/386; 427/389.7; 428/192; 428/268; 428/257; 428/258; 428/417
[58] Field of Search ............... 428/268, 273, 193, 192, 428/257, 258, 417; 427/386, 389.7

[56] References Cited

U.S. PATENT DOCUMENTS

| | | | |
|---|---|---|---|
| 4,894,276 | 1/1990 | Bryant | 428/193 |
| 5,085,917 | 2/1992 | Hodnett | 428/193 |
| 5,236,777 | 8/1993 | Inoguchi et al. | 428/268 |
| 5,273,816 | 12/1993 | Olson et al. | 428/417 |

*Primary Examiner*—James J. Bell
*Attorney, Agent, or Firm*—Nixon & Vanderhye

[57] ABSTRACT

A raveling-preventing agent for a glass fiber woven fabric, which contains as essential components a reaction product from an epoxy resin having an epoxy equivalent of 150 to 1,000 and a molecular weight of 500 to 2,000 and a hydroxyl group-containing amine compound, and an isocyanate curing agent. The raveling-preventing agent firmly binds glass fibers together and prevents the raveling of edge-forming warp yarns when applied to sectioned marginal portions of a glass fiber woven fabric. Further it is free from swelling in a solvent used in a thermosetting resin varnish.

16 Claims, No Drawings

RAVELING-PREVENTING AGENT FOR GLASS FIBER WOVEN FABRIC, AND GLASS FIBER WOVEN FABRIC TO WHICH THE AGENT IS APPLIED

BACKGROUND OF THE INVENTION

1. Field of the Invention

The present invention relates to a raveling-preventing agent for a glass fiber woven fabric. The raveling-preventing agent of the present invention is preferably used for preventing the marginal raveling and the margin of a glass fiber woven fabric which is produced by means of an air-jet loom, etc., and used for producing a copper-clad laminate.

2. Prior Art

A glass fiber woven fabric has been mostly produced by means of a shuttle loom, while it is recently increasingly produced by means of a shuttleless loom such as an air-jet loom. In the field of copper-clad laminates where a large amount of glass fiber woven fabrics are used, nearly all of the glass fiber woven fabrics are produced by means of an air-jet loom. When an air-jet loom is used, the weft is cut every time when it is allowed to run from edge to edge across a fabric to be produced. As a result, a loose marginal portion of the weft yarns is present in each of the side portions of the fabric (the term "loose marginal portion" is also called "feathered edge"). As is well known, a glass fiber woven fabric for a copper-clad laminate is impregnated with a varnish of a thermosetting resin such as an epoxy resin and dried to prepare a prepreg. A plurality of the so-prepared prepregs were stacked, copper foil(s) is/are stacked, and heat and pressure are applied to obtain a copper-clad laminate.

When a prepreg is prepared from a glass fiber woven fabric having feathered edges, produced by means of a shuttleless loom such as an air-jet loom, the following problems occur.

The first problem is that since the feathered edges of a glass fiber woven fabric contain an excess of a resin, the feathered edges tend to have a larger thickness than any other portion. When a prepreg having a larger thickness in the feathered edges as described above is cut to a predetermined size and stacked, the resultant stack has a larger thickness in a place where the above feathered edges are present together, and the stack is consequently not entirely uniform in thickness. The above prepreg stack which is not uniform in thickness across the entirety of its width causes a variety of disadvantages when used for producing a product. For example, when a copper-clad laminate is produced from such a prepreg stack, there is a defect in that the prepreg stack cannot be pressed in the entirety of its width.

The second problem is that when the form of each edge of the prepreg is viewed along its length, each edge does not have a linear form, but has an uneven form due to the feathered edges. When the prepreg whose edges have an uneven form is cut to a predetermined size and stacked, there is a defect in that it is difficult to bring the edge of the marginal portions in line. Further, when the edges of the marginal portions are brought in line, the uneven edge portions are partially cut or broken to pieces and the resulting pieces are spattered to be included in the prepreg, which inclusion causes defective products.

The third problem is that when a prepreg is produced, the loose marginal portions of a glass fiber woven fabric are partially cut or broken and the resulting pieces are included in a varnish and adhere to the prepreg surface, which ends up in defective products.

When a prepreg is prepared from a glass fiber woven fabric having loose marginal portions, the foregoing problems arise, while the above first problem similarly occurs concerning the marginal portion of a glass fiber woven fabric produced by means of a shuttle loom.

For avoiding the first and second problems, there may be employed a method in which the marginal portion is removed by cutting it off from the produced prepreg. In this case, however, the third problem cannot be avoided. Further, the yields of the glass fiber woven fabric and varnish decrease, which is costwise undesirable.

Further, there may be employed a method in which the marginal portion of a glass fiber woven fabric is removed before the prepreg is prepared from the glass fiber woven fabric, and some proposals have been made. For example, there is a method in which the loose marginal portion is cut off by melting it with laser light while the remaining end portion is simultaneously bound. There is also a method in which yarns of a thermoplastic resin are incorporated as marginal portions of part of warp yarns for a glass fiber woven fabric and the yarns of a thermoplastic resin are fused after the glass fiber woven fabric is produced. However, the method using laser light has not yet been put to practical use, since it has problems in that the cutting rate by melting cannot be increased and that the melting drip of small balls in a varnish occurs at a prepreg step. The problem with the method of incorporating yarns of a thermoplastic resin as marginal portions is that this method can be applied only to a special woven fabric, since the general step of heat cleaning for producing a glass fiber woven fabric cannot be carried out.

Further, it has been proposed to apply a hot-melt adhesive to the marginal portion of a glass fiber woven fabric for overcoming the above problems. Since, however, a glass fiber woven fabric is heated around a temperature of 150° C. in a prepreg step while the hot-melt adhesive contains a solvent, warp yarns of the marginal portion ravel under some conditions to cause a trouble of being caught in a roller of a prepreg apparatus. Further, there is another problem: The marginal portions to which the hot-melt adhesive has been applied are thicker to some extent, and when the produced prepreg is cut to a predetermined size and stacked, the prepreg stack has a larger thickness in the marginal portions than in the central portion, which thickness difference hinders the automation of a lamination step.

SUMMARY OF THE INVENTION

It is a first object of the present invention to provide a raveling-preventing agent for a glass fiber woven fabric, which firmly binds glass fibers together and prevents the raveling of edge-forming warp yarns when applied to sectioned marginal portions of a glass fiber woven fabric and which is free from swelling in a solvent used in a thermosetting resin varnish.

It is a second object of the present invention to provide a glass fiber woven fabric to the sectioned marginal portion of which a raveling-preventing agent is applied, which fabric is capable of giving a prepreg having a uniform thickness entirely across the width, having two edges being individually straight, having an even surface in the length direction and being free of deterioration of product quality caused by pieces of glass fibers cut away from the marginal portions and adhering to other portions.

The raveling-preventing agent for a glass fiber woven fabric, which achieves the first object, contains as essential components a reaction product from an epoxy resin having an epoxy equivalent of 150 to 1,000 and a molecular weight of 500 to 2,000 and a hydroxyl group-containing amine compound, and an isocyanate curing agent.

The glass fiber woven fabric which achieves the second object is obtained by applying the above raveling-preventing agent to a predetermined width of a glass fiber woven fabric along its marginal portions and curing it, the amount of the agent being 2 to 10% by weight based on an agent-applied portion of the glass fiber woven fabric.

DETAILED DESCRIPTION OF THE INVENTION

The reaction product from an epoxy resin and a hydroxyl group-containing amine compound (to be referred to as "epoxy-amine reaction product" hereinafter), which is an essential component of the raveling-preventing agent of the present invention, is obtained by reacting an epoxy resin having an epoxy equivalent of 150 to 1,000 and a molecular weight of 500 to 2,000 with a hydroxyl group-containing amine compound.

The epoxy resin as a raw material for the epoxy-amine reaction product may be any one of bisphenol type ones and novolak type ones, while the epoxy equivalent thereof is limited to 150 to 1,000 and the molecular weight thereof is limited to 500 to 2,000 for the following reasons. When the above epoxy equivalent and the above molecular weight are smaller than the above corresponding lower limits, no sufficient adhesion among glass fibers can be obtained for achieving an adequate effect on prevention of raveling. When the above epoxy equivalent and the above molecular weight are larger than the above corresponding upper limits, a portion to which the agent is applied is fragile and undergoes cracking and breaking.

The hydroxyl group-containing amine compound to be reacted with the epoxy resin is preferably a primary or secondary amine compound containing a hydroxyl group. Specific examples thereof include monoethanolamine, mono-n-propanolamine, monoisopropanolamine, monobutanolamine, diethanolamine, methylaminoethanol, ethylaminoethanol and dipropanolamine.

For example, the epoxy resin and diethanolamine are allowed to react as follows. A solvent is added to the epoxy resin so that the concentration of the epoxy resin becomes about 20–about 70%, and the resultant mixture is heated up to the boiling point of the solvent. The solvent can be selected from those which can dissolve the epoxy resin and the hydroxyl group-containing amine compound, such as diacetone alcohol and isopropyl cellosolve. Then, the hydroxyl group-containing amine compound is added dropwise to the epoxy resin mixture to react it with the epoxy resin. When the reaction finished, the reaction mixture is cooled to room temperature, whereby the epoxy-amine reaction product as one of essential components of the raveling-preventing agent of the present invention can be obtained.

In the above reaction, it is preferred to allow the epoxy rings at both terminals of the epoxy resin to react with hydroxyl group-containing amine compounds, one epoxy ring with one hydroxyl group-containing amine compound and the other epoxy ring with another hydroxyl group-containing amine compound. By this reaction, there is obtained an epoxy-amine reaction product each terminal of which has a hydroxyl group derived from the above amine compound.

The raveling-preventing agent of the present invention further contains, as an essential component, an isocyanate curing agent which is to react with the hydroxyl groups of the above epoxy-amine reaction product to form urethane bonds and cure the epoxy-amine reaction product. The isocyanate curing agent can be freely selected from those which react with the hydroxyl group to form a urethane bond. Examples thereof include polyisocyanates such as tolylene diisocyanate, xylylene diisocyanate, hexamethylene diisocyanate, diphenylmethane diisocyanate, isophorone diisocyanate, 4,4-dicyclohexylmethane diisocyanate and triphenylmethane triisocyanate. Isocyanates have a defect in that they react with water to decompose. In view of storage stability and achievement of complete reaction with the above epoxy-amine reaction product, preferred are blocked isocyanates obtained by blocking the —NCO groups of polyisocyanates with a blocking agent such as phenol, oxime, lactam, malonate, alkyl acetoacetate, or the like. The isocyanate curing agent is preferably used in such an amount that the number of the isocyanate groups is 1 to 2 per hydroxyl group of the above epoxy-amine reaction product. When the above amount is less than the above range, the reaction does not sufficiently proceed and the raveling-preventing effect is insufficient. When the above amount is greater than the above range, the reaction does not sufficiently proceed, either. The temperature for the curing is 160° to 240° C., and the time therefor is 10 seconds to 1 minute to complete the curing.

When the raveling-preventing agent of the present invention is used, the above two essential components are dissolved in a solvent. Although not specially limited, the solvent is selected from those which can dissolve the essential components, such as acetone, methyl cellosolve, n-hexane and methyl ethyl ketone. The amount of the solvent is preferably 10 to 20 times as large as the amount of the above epoxy-amine reaction product.

The so-prepared raveling-preventing agent is applied to that portion of a glass fiber woven fabric which is to be prevented from raveling. The amount of the raveling-preventing agent is 2 to 10% by weight (solid content) based on the agent-applied portion of a glass fiber woven fabric. The raveling-preventing agent is preferably applied by a method using a roller, while it may be applied by a method using a brush. The raveling-preventing agent may be applied to any place on a glass fiber woven fabric where the raveling is to be prevented. When it is applied to a glass fiber woven fabric having loose marginal portions, produced by means of an air-jet loom, it is preferred to apply it to the marginal portions having a width of about 10 mm in the warp yarn direction.

The glass fiber woven fabric to which the raveling-preventing agent has been applied is then introduced into a heating step to dry the solvent and carry out a curing reaction of the raveling-preventing agent. The heating conditions differ depending upon the kind and amount of the solvent as well as the kind and amount of the curing agent, while the curing reaction is completed at a heating temperature of 160° to 240° C. for 10 seconds to 1 minute as described above. After heated, the glass fiber woven fabric is further cut with a slitter along the center of each marginal portion to which the raveling-preventing agent is applied in the width of about 10 mm. This cutting is carried out simultaneously in both the marginal portions of the glass fiber woven fabric. Therefore, the resultant glass fiber woven fabric has two marginal portions to which the raveling-preventing agent has been applied in a width of about 5 mm each, and the marginal portions including the loose marginal portions are removed.

The glass fiber woven fabric to which the raveling-preventing agent of the present invention is to be applied is preferably heat-cleaned after produced, and then treated with a surface treating agent such as a silane coupling agent. Further, after heat-cleaned and before surface-treated, the glass fiber woven fabric may be treated by applying the raveling-preventing agent thereto, and then surface-treated. Moreover, in some field, a woven fabric of glass yarns is produced by using a specific sizing agent, removal of which by heat-cleaning is not necessary after the production of the woven fabric. When such a woven fabric is used, no heat-cleaning step is required and further, no surface treatment step is required since the sizing agent contains a surface treating agent. Therefore, the as-produced glass fiber woven fabric can be subjected to raveling-preventing treatment.

The raveling-preventing agent of the present invention contains a reaction product from an epoxy resin and a hydroxyl group-containing amine compound (epoxy-amine reaction product) and an isocyanate curing agent. And, when the former is cured by the latter, the raveling-preventing agent gives a cured product having properties of the epoxy resin and properties of a urethane resin. Therefore, it has an excellent raveling-preventing effect and solvent resistance as well. Further, since this curing reaction is a urethane bond forming reaction, the cured product has coating film formability, and the coating film has flexibility although it is a three-dimensionally cured product. Furthermore, the epoxy-amine reaction product per se has an amino group, and the amino group promotes a reaction between the hydroxyl group and the isocyanate group. As a result, the curing reaction proceeds very rapidly. Therefore, the raveling-preventing agent of the present invention is excellent in producitivity.

When the isocyanate curing agent is selected from blocked ones, the reaction does not proceed at room temperature. Therefore, there is almost no problem concerning the pot life of a solution of the raveling-preventing agent.

The glass fiber woven fabric to which the raveling-preventing agent of the present invention has been applied does not undergo breaking or cracking in the applied portion, since the coating film has flexibility. Further, since the coating film has high strength, the raveling-preventing agent can exhibit a raveling-preventing effect even when it is used in a small amount. Therefore, there is almost no difference in thickness between the applied portion and other portion to which the agent has not been applied. For this reason, when a prepreg is prepared from the glass fiber woven fabric to which the raveling-preventing agent of the present invention, cut to a predetermined size and stacked, there is almost no difference in thickness between the central portion and the marginal portion. Further, since the raveling-preventing agent of the present invention has a three-dimensional structure, the glass fiber woven fabric to which the agent has been applied does not undergo raveling when a prepreg is prepared by immersing the glass fiber woven fabric in a varnish of the epoxy resin.

The present invention will be explained more in detail by reference to Examples hereinafter.

EXAMPLE 1

(1) A solution of a raveling-preventing agent was prepared as follows.

(a) an epoxy-amine reaction product prepared by reacting 1 mol of a bisphenol. A type epoxy resin (epoxy equivalent: 450–500, molecular weight: 900) with 2 mol of diethanolamine.

(b) A blocked diisocyanate curing agent (ethyl acetoacetate-blocked isocyanaurate of hexamethylene diisocyanate, NCO=10.2%, solid content 80%)

The above (a) epoxy-amine reaction product and the (b) blocked diisocyanate curing agent were mixed in such amounts that the number of isocyanate groups of the (b) blocked diisocyanate curing agent per hydroxyl group of the (a) epoxy-amine reaction product was 2, and the mixture was dissolved in methyl cellosolve in such amounts that the solid content in the resultant solution was 20%, whereby a solution of a raveling-preventing agent was obtained.

(2) The solution of the raveling-preventing agent obtained in (1) was applied to the two 10 mm wide marginal portions of a glass fiber woven fabric along the warp yarns, and then cured by heating it at 210° C. for 10 seconds. The amount of the preventing agent was 2.6% of the weight of the applied portion of the glass fiber woven fabric. As the glass fiber woven fabric, WEA18W-BZ2 (manufactured by Nitto Boseki Co., Ltd.) was used.

(3) The glass fiber woven fabric prepared in (2) was cut along the center of each marginal portion to which the raveling-preventing agent was applied in the direction of warp yarns. And, one warp yarn present on the marginal end was measured for adhesion strength by pulling it, and the adhesion strength was taken as selvage raveling strength (g).

Further, the glass fiber woven fabric to which the preventing agent was applied was immersed in a variety of solvents (25° C.) for 72 hours to evaluate its solvent resistance. Table 1 shows the results. In Table 1, O shows no change in the applied portion, and X shows that warp yarns of the applied portion raveled while the glass fiber woven fabric was immersed in the solvent.

EXAMPLE 2

Example 1 was repeated except that the ratio of isocyanate group to hydroxyl group was changed to 1.5. Table 1 shows the results.

EXAMPLE 3

Example 1 was repeated except that the ratio of isocyanate group to hydroxyl group was changed to 1.3. Table 1 shows the results.

COMPARATIVE EXAMPLE 1

Example 1 was repeated except that the bisphenol A type epoxy resin was replaced with a bisphenol A type epoxy resin (epoxy equivalent: 184–194, molecular weight: 380). Table 1 shows the results.

Table 1 shows the selvage raveling strengths of the warp yarns of the marginal portions of the glass fiber woven fabrics obtained in Examples 1 to 3 and Comparative Example 1 and solvent resistance of each of their portions to which the raveling-preventing agents were applied.

TABLE 1

|  | Example | | | Comparative Example |
|---|---|---|---|---|
|  | 1 | 2 | 3 | 1 |
| Selvage raveling strength (g) | 40.1 | 28.2 | 29.7 | 6.1 |
| Solvent Resistance | | | | |
| Methyl cellosolve | O | O | O | X |
| Methyl ethyl ketone | O | O | O | X |
| Methanol | O | O | O | X |
| n-Hexane | O | O | O | X |
| Acetone | O | O | O | X |
| Toluene | O | O | O | X |
| Dimethylformamide | O | O | O | X |

Table 1 clearly shows that Examples 1 to 3 were remarkably excellent over Comparative Example 1 in selvage raveling strength and solvent resistance.

What is claimed is:

1. A raveling-preventing agent for a glass fiber woven fabric, which contains as essential components a reaction product from an epoxy resin having an epoxy equivalent of 150 to 1,000 and a molecular weight of 500 to 2,000 and a hydroxyl group-containing amine compound, and an isocyanate curing agent.

2. An agent according to claim 1, wherein the epoxy resin is a bisphenol A or novolack epoxy resin.

3. An agent according to claim 1, wherein the hydroxyl group-containing amine compound is a primary or secondary amine compound containing a hydroxyl group.

4. An agent according to claim 1, wherein the hydroxyl group-containing amine compound is at least one selected from the group consisting of monoethanolamine, mono-n-propanolamine, monoisopropanolamine, monobutanolamine, diethanolamine, methylaminoethanol, ethylaminoethanol and dipropanolamine.

5. An agent according to claim 1, wherein the reaction product from an epoxy resin and a hydroxyl group-containing amine compound is a product obtained by adding a solvent to the epoxy resin up to an epoxy resin concentration of about 20 to about 70%, heating the resultant mixture up to a boiling point of the solvent, and adding the hydroxyl group-containing amine compound to the mixture.

6. An agent according to claim 1, wherein the reaction product from an epoxy resin and a hydroxyl group-containing amine compound is a product obtained by reacting epoxy rings at both terminals of the epoxy resin with the hydroxyl group-containing amine compound, one epoxy ring with one hydroxyl group-containing amine compound and the other epoxy ring with another hydroxyl group-containing amine compound.

7. An agent according to claim 1, wherein the isocyanate curing agent is at least one member selected from the group consisting of tolylene diisocyanate, xylylene diisocyanate, hexamethylene diisocyanate, diphenylmethane diisocyanate, isophorone diisocyanate, 4,4-dicyclohexylmethane diisocyanate and triphenylmethane triisocyanate.

8. An agent according to claim 1, wherein the isocyanate curing agent is a blocked isocyanate obtained by blocking —NCO groups of a polyisocyanate with a blocking agent selected from phenol, oxime, lactam, malonate and alkyl acetoacetate.

9. An agent according to claim 8, wherein the polyisocyanate to be blocked is selected from the group consisting of tolylene diisocyanate, xylylene diisocyanate, hexamethylene diisocyanate, diphenylmethane diisocyanate, isophorone diisocyanate, 4,4-dicyclohexylmethane diisocyanate and triphenylmethane triisocyanate.

10. An agent according to claim 1, wherein the isocyanate curing agent is contained in such an amount that the number of the isocyanate groups is 1 to 2 per hydroxyl group of the reaction product from an epoxy resin and a hydroxyl group-containing amine compound.

11. An agent according to claim 1, wherein a solvent is contained.

12. An agent according to claim 11, wherein the solvent is at least one member selected from the group consisting of acetone, methyl cellosolve, n-hexane and methyl ethyl ketone.

13. A glass fiber woven fabric obtained by applying a raveling-preventing agent containing as essential components a reaction product from an epoxy resin having an epoxy equivalent of 150 to 1,000 and a molecular weight of 500 to 2,000 and a hydroxyl group-containing amine compound and an isocyanate curing agent to a predetermined width of a glass fiber woven fabric along its marginal portions and curing it, the amount of the agent being 2 to 10% by weight based on an agent-applied portion of the glass fiber woven fabric.

14. A glass fiber woven fabric according to claim 13, wherein the raveling-preventing agent is applied to two about 10 mm wide marginal portions of the glass fiber woven fabric in the warp yarn direction.

15. A glass fiber woven fabric according to claim 13, which is produced by curing the raveling-preventing agent at a heating temperature of 160° to 240° C. for a heating time of 10 seconds to 1 minute.

16. A glass fiber woven fabric according to claim 13, which is produced from a glass fiber woven fabric which has been heat-cleaned after produced and then treated with a surface treating agent.

* * * * *